(12) United States Patent
Kranz (10) Patent No.: US 11,255,488 B2
(45) Date of Patent: Feb. 22, 2022

(54) ILLUMINATION DEVICE FOR A CAMERA OR AN OPTICAL SENSOR

(71) Applicant: Carl Zeiss Industrielle Messtechnik GmbH, Oberkochen (DE)

(72) Inventor: Christoph Kranz, Giengen an der Brenz (DE)

(73) Assignee: Carl Zeiss Industrielle Messtechnik GmbH, Oberkochen (DE)

( * ) Notice: Subject to any disclaimer, the term of this patent is extended or adjusted under 35 U.S.C. 154(b) by 46 days.

(21) Appl. No.: 16/707,605

(22) Filed: Dec. 9, 2019

(65) Prior Publication Data

US 2020/0224827 A1 Jul. 16, 2020

(30) Foreign Application Priority Data

Dec. 14, 2018 (DE) ...................... 10 2018 221 825.0

(51) Int. Cl.
| | |
|---|---|
| *H04N 5/225* | (2006.01) |
| *F21K 9/20* | (2016.01) |
| *G01B 11/00* | (2006.01) |
| *G03B 15/03* | (2021.01) |
| *H04N 5/235* | (2006.01) |
| *F21Y 115/10* | (2016.01) |

(52) U.S. Cl.
CPC .............. *F21K 9/20* (2016.08); *G01B 11/005* (2013.01); *G03B 15/03* (2013.01); *H04N 5/2256* (2013.01); *H04N 5/2354* (2013.01); *F21Y 2115/10* (2016.08)

(58) Field of Classification Search
CPC ... G01B 11/005; G03B 15/03; F21Y 2115/10; F21K 9/20; H04N 5/2256; H04N 5/2354
See application file for complete search history.

(56) References Cited

U.S. PATENT DOCUMENTS

| | | | |
|---|---|---|---|
| 5,690,417 A | 11/1997 | Polidor et al. | |
| 6,542,238 B1 | 4/2003 | Tsuboi et al. | |
| 7,256,833 B2 * | 8/2007 | Shaw ................... | H04N 5/2256 118/713 |

(Continued)

FOREIGN PATENT DOCUMENTS

| | | |
|---|---|---|
| DE | 19653234 A1 | 11/1997 |
| DE | 10030772 A1 | 10/2001 |

(Continued)

*Primary Examiner* — Fatima N Farokhrooz
(74) *Attorney, Agent, or Firm* — Miller Johnson (57) ABSTRACT

An illumination device includes first, second, and third light-emitting diode chips arranged around a center axis along virtual outlines of first, second, and third geometric figures, respectively. The geometric figures are concentric. A bond wire is connected to a connection point of each chip in its peripheral region. Multiple groups are defined, with each including one each of the first, second, and third chips. Within a first group, the first, second, and third chips are arranged on first, second, and third virtual rays, respectively. The rays each intersect only a single light-emitting diode chip, are transverse to the center axis, and originate at, and extend outwardly from, the center axis. In the first group, the second chip neighbors the first chip, the third chip neighbors the second chip, and the chips are rotated relative to one another such that the respective connection points are oriented in different directions.

13 Claims, 4 Drawing Sheets

(56) References Cited

U.S. PATENT DOCUMENTS

| | | | |
|---|---|---|---|
| 9,632,036 B2 | 4/2017 | Sun | |
| 9,857,164 B2 | 1/2018 | Seitz et al. | |
| 10,139,350 B2 | 11/2018 | Sun | |
| 2012/0133824 A1* | 5/2012 | Shaw | H04N 5/2256 |
| | | | 348/370 |
| 2013/0215596 A1* | 8/2013 | Holman | G03B 15/05 |
| | | | 362/84 |
| 2014/0292213 A1 | 10/2014 | Yoon et al. | |
| 2015/0048394 A1* | 2/2015 | Shim | H01L 25/0756 |
| | | | 257/89 |
| 2015/0355101 A1 | 12/2015 | Sun | |
| 2017/0186152 A1 | 6/2017 | Sun | |
| 2017/0241769 A1* | 8/2017 | Seitz | G02B 19/0066 |
| 2019/0056331 A1 | 2/2019 | Sun | |

FOREIGN PATENT DOCUMENTS

| | | |
|---|---|---|
| DE | 10064544 A1 | 6/2002 |
| DE | 69909252 T2 | 5/2004 |
| DE | 202005011807 U1 | 12/2005 |
| DE | 102014115983 A1 | 5/2015 |
| DE | 102015210440 A1 | 12/2015 |
| DE | 102016102971 A1 | 8/2017 |
| DE | 102016223710 A1 | 5/2018 |
| DE | 102017211680 A1 | 1/2019 |
| GB | 2497768 A | 6/2013 |

\* cited by examiner

ILLUMINATION DEVICE FOR A CAMERA OR AN OPTICAL SENSOR

CROSS-REFERENCES TO RELATED APPLICATIONS

This application claims priority from German patent application DE 10 2018 221 825.0, filed Dec. 14, 2018. The entire contents of this priority application is incorporated herein by reference.

BACKGROUND OF THE INVENTION

The present invention relates to an illumination device that is able to be used in an optical sensor of a coordinate measuring machine and to an optical sensor having said illumination device.

Optical sensors for a coordinate measuring machine have for example a camera as an optical capturing device. For illuminating a workpiece to be measured using incident light, it is known practice to provide a ring light that is arranged around the optical axis of the camera. It is furthermore known practice to produce illumination devices that have one or more LEDs as the light source.

Such an illumination device is illustrated for example in the application DE 10 2017 211 680 A, which had not yet been published at the time this application was filed. It is known generally, and from that document, to provide a ring light with light sources that are drivable, or controllable, in segments. For example, it is possible to switch different light sources in different circular segments on and off individually such that the illumination angle can be changed.

In such segmented light sources, as they are known, the problem of non-uniform illumination of the observation field of the camera frequently arises. The problem is that a typically rectangular observation field of the camera system (rectangular sensor surface) must be illuminated using square LED chips, which are typically used as the light sources. Such LED chips furthermore have, as a connection, a bond wire for electric connection, with no light source being present at the connection point thereof and no light being emitted there. Inhomogeneities in the illumination are observed.

It was an object of the invention to provide an illumination device with which uniform illumination is possible, in particular when only one segment of the illumination device is used.

SUMMARY OF THE INVENTION

To achieve said object, the invention specifies an illumination device as claimed in claim 1. Advantageous configurations are specified in the dependent claims.

An illumination device is specified, said illumination device having:
  first light-emitting diode chips, arranged around a center axis along a virtual outline of a first geometric figure,
  second light-emitting diode chips, arranged around the center axis along a virtual outline of a second geometric figure, which is concentric with respect to the first geometric figure,
  third light-emitting diode chips, arranged around the center axis along a virtual outline of a third geometric figure, which is concentric with respect to the first geometric figure,
wherein each of the light-emitting diode chips is connected to a bond wire at a connection point on the light-emitting diode chip, wherein the connection point is located in a peripheral region of the light-emitting diode chip, wherein the light-emitting diode chips are grouped into a plurality of groups such that a group has in each case at least one of the first light-emitting diode chips, at least one of the second light-emitting diode chips, and at least one of the third light-emitting diode chips, wherein, in the group, the second light-emitting diode chip neighbors the first light-emitting diode chip, and the third light-emitting diode chip neighbors the second light-emitting diode chip, and wherein, in the group, the first light-emitting diode chip, the second light-emitting diode chip, and the third light-emitting diode chip are rotated relative to one another such that the connection points of a plurality of light-emitting diode chips or of all the light-emitting diode chips of the group are oriented in different directions.

The illumination device can optionally have: further light-emitting diode chips, which are arranged around the center axis along a virtual outline of a further geometric figure or are arranged along virtual outlines of further geometric figures, wherein the further geometric figure(s) is/are concentric with respect to the first geometric figure.

A stated group can optionally have at least one of the further light-emitting diode chips.

In the group, a further light-emitting diode chip, if present, can neighbor the third light-emitting diode chip, or, in the case of a plurality of further light-emitting diode chips, one of the further light-emitting diode chips can neighbor the third light-emitting diode chip and the other further light-emitting diode chips can neighbor one another in pairs.

In the group, the first light-emitting diode chip, the second light-emitting diode chip, and the third light-emitting diode chip, and, if present, the further light-emitting diode chip(s) are rotated relative to one another such that the connection points of a plurality of light-emitting diode chips or of all the light-emitting diode chips of the group are oriented in different directions.

A stated group represents in particular an illumination segment that is separately switchable. Consequently, each group of light-emitting diode chips can be able to be switched on and off independently of another group of light-emitting diode chips. Alternatively or in addition thereto, each group of light-emitting diode chips can have a different light color independently of another group of light-emitting diode chips.

The term "arranged along" means that the elements that are thus arranged, such as for example LED chips, are arranged on the virtual outline or adjoining the virtual outline, wherein variations of the arrangement are possible from element to element so that for example a first light-emitting diode chip is arranged on the virtual outline of the first geometric figure, a further first light-emitting diode chip is arranged adjoining but not on the outline, etc. "Adjoining" means in particular that the element still touches the outline. Preferably, stated elements are arranged on the virtual outline, wherein variations can be possible here too, that is to say the elements do not all have to be arranged in the center of the outline, or centered on the outline.

The invention allows particularly uniform illumination if only one of the groups, or a plurality of groups but not all of the light-emitting diodes, light-emitting diode chips, or groups (also LEDs below) of the entire illumination device, are used for the illumination. This is accomplished by virtue of the fact that the first light-emitting diode chip, the second light-emitting diode chip, and the third light-emitting diode chip, and, if present, the further light-emitting diode chip(s) are rotated relative to one another such that the connection points of a plurality of light-emitting diode chips or of all the light-emitting diode chips of the group are oriented in different directions. In this way, regions of the LED chips from which no light emerges are spatially distributed as uniformly as possible, which brings about the desired effect.

A light-emitting diode chip has a light-emitting surface. Said light-emitting surface constitutes most of, but not the entire surface of the light-emitting diode chip. For example, at the location where the bond wire is connected, the surface does not emit light or the surface is obscured there by the bond wire.

The light-emitting diode chip (also LED chip) is a light-producing chip, for example having semiconductor material and connecting elements. The light-emitting diode chip is part of a light-emitting diode that, in addition to the light-emitting diode chip, can also have further components which are known per se, such as for example the aforementioned bond wire, metal holders, connections, housing, lens element, etc.

As an alternative or in addition to the formulation: "illumination device, having first/second/third/fourth . . . light-emitting diode chips," the invention can also be expressed by the alternative formulation: "illumination device, having first/second/third/fourth . . . light-emitting diodes, (each, that is to say the light-emitting diode) having a first/second/third/fourth . . . light-emitting diode chip." For the description of the invention, the expression "first/second/third/fourth . . . light-emitting diode chips" can be replaced by the expression "first/second/third/fourth . . . light-emitting diodes, each having a first/second/third/fourth . . . light-emitting diode chip." Consequently, a first light-emitting diode has a first light-emitting diode chip, a second light-emitting diode has a second light-emitting diode chip, etc.

The aforementioned center axis is a spatial axis around which the LED chips are arranged. The radiation direction of the light can be in the direction of or parallel to the center axis, or transverse to the center axis.

The aforementioned geometric figures do not represent actual components but indicate a principle of arrangement of the LED chips.

The term concentric means that the geometric figures that are concentric with respect to one another exhibit the same centroid. In particular, the centroid is located on the center axis. According to the invention, all the geometric figures are concentric with respect to one another.

The geometric figures can be plane geometric figures. In particular, first LED chips can be located in one plane or be substantially located in one plane, second LED chips can be located in one plane or be substantially located in one plane, etc.

The aforementioned different geometric figures (first, second, etc.) can be located in a common plane.

The geometric figure in each case can be chosen arbitrarily, for example it can be a circle, an ellipse, or a rectangle, in particular a square. A circle is particularly advantageous. In this case, LED chips are arranged in the shape of a ring, and the illumination device is configured as a ring light.

First light-emitting diode chips are preferably situated more closely to the center axis than second light-emitting diode chips. Preferably, second light-emitting diode chips are situated more closely to the center axis than third light-emitting diode chips. Third light-emitting diode chips are preferably situated more closely to the center axis than further light-emitting diode chips, for example fourth, fifth LED chips mentioned below. Accordingly, the first geometric figure preferably has a smaller perimeter than the second geometric figure, the second geometric figure preferably has a smaller perimeter than the third geometric figure, the third geometric figure preferably has a smaller perimeter than a further geometric figure.

The term "neighbors" means that no further LED chip is present between neighboring LED chips, in particular not on an imaginary line between centroids of the LED chips. The term "neighbors" does not necessarily mean that a neighboring LED chip must be an LED chip with the shortest distance. It is possible that a further LED chip is present which likewise neighbors it and is situated closer, but does not belong to the same group.

It has already been mentioned that further LED chips can be present. That means that the principle of the present invention can logically be continued beyond the arrangement of the first, second and third LED chips. This will be explained below in special cases:

In one embodiment, the illumination device has fourth light-emitting diode chips as further light-emitting diode chips, which are arranged around the center axis along a virtual outline of a fourth geometric figure, which is concentric with respect to the first geometric figure, wherein each group in each case has at least one of the fourth light-emitting diode chips, wherein the fourth light-emitting diode chip in the group neighbors the third light-emitting diode chip in the group.

In one embodiment, the illumination device furthermore has fifth light-emitting diode chips as further light-emitting diode chips, which are arranged around the center axis along a virtual outline of a fifth geometric figure, which is concentric with respect to the first geometric figure, wherein each group in each case has at least one of the fifth light-emitting diode chips, wherein the fifth light-emitting diode chip in the group neighbors the fourth light-emitting diode chip in the group.

In one embodiment, the illumination device furthermore has sixth light-emitting diode chips as further light-emitting diode chips, which are arranged around the center axis along a virtual outline of a sixth geometric figure, which is concentric with respect to the first geometric figure, wherein each group in each case has at least one of the sixth light-emitting diode chips, wherein the sixth light-emitting diode chip in the group neighbors the fifth light-emitting diode chip in the group.

This principle can be continued as desired for seventh, eighth, ninth, etc. light-emitting diode chips which are arranged in each case on a virtual outline of a seventh, eighth, ninth, etc. geometric figure.

Each of the fourth, fifth, sixth, etc. light-emitting diode chips is connected to a bond wire at a connection point on the light-emitting diode chip, wherein the connection point is located in a peripheral region of the light-emitting diode chip.

In the group, the fourth, fifth, sixth, etc. light-emitting diode chip is rotated relative to the other light-emitting diode chips in the group such that the connection point of the fourth, fifth, sixth, etc. light-emitting diode chips is oriented in a different direction than the connection points of the other light-emitting diode chips in the group.

In one embodiment of the illumination device, an angle of the relative rotation for a pair of neighboring light-emitting diode chips in the group is 360°/n, with n being the number of light-emitting diode chips in the group. That means that an angle of rotation for a pair of neighboring light-emitting diode chips in the group is identical to the angle of rotation of another pair or of each other pair of neighboring light-emitting diode chips.

If the group has three LED chips (first, second, third, n=3), the relative angle of rotation between the first and the second LED chip is consequently 120° and the relative angle of rotation between the second and the third LED chip is likewise 120°. This is based on a same direction of rotation in each case. The angle between the third and the first LED chip, which do not neighbor another, for an assumed same continued direction of rotation of the third LED chip, is again 120°. If a group has four LED chips (n=4), an angle will be 90°.

In one embodiment of the invention, the light-emitting diode chips in a group are arranged along a virtual straight line that is transverse to the center axis and extends outwardly proceeding from the center axis. The light-emitting diode chips are then arranged in particular on points of intersection between said straight line and the particular geometric figure. In other words, for example a first light-emitting diode chip is arranged both on the virtual outline of the first geometric figure and on said straight line, specifically on the point of intersection of the straight line with the first geometric figure. Likewise, a second light-emitting diode chip is then arranged both on the virtual outline of the second geometric figure and on said straight line, specifically on the point of intersection of the straight line with the second geometric figure. The same applies to the third light-emitting diode chip and to further light-emitting diode chips.

In an alternative embodiment thereto, the light-emitting diode chips of a group are arranged on different virtual straight lines that are transverse to the center axis and extend outwardly proceeding from the center axis. In this embodiment, the light-emitting diode chips are offset from one another when viewed along the virtual outlines of the geometric figures. For example, a first light-emitting diode chip is arranged both on the virtual outline of the first geometric figure and on a first straight line, specifically on the point of intersection of the first straight line with the first geometric figure. Likewise, a second light-emitting diode chip is then arranged both on the virtual outline of the second geometric figure and on a second straight line, specifically on the point of intersection of the second straight line with the second geometric figure. The same applies to the third light-emitting diode chip and to further light-emitting diode chips.

In the embodiment just mentioned, the different straight lines can be located in one plane.

In a particular variant of the embodiment just mentioned, an angle between neighboring straight lines is constant.

In one embodiment of the illumination device according to the invention, in each group of light-emitting diode chips, at least two of the light-emitting diode chips in that group, preferably all of said group, are drivable, or controllable, independently of light-emitting diode chips of another group of light-emitting diode chips. The light-emitting diode chips are in particular drivable, or controllable, to switch the respective light-emitting diode on or off. The term drivable or controllable may, in particular, have the meaning of activatable or switchable.

In one embodiment of the illumination device according to the invention, in one or more groups of light-emitting diode chips, at least two of the light-emitting diode chips in said group are drivable, or controllable, independently of further light-emitting diode chips of said group. The light-emitting diode chips are in particular drivable, or controllable, to switch the respective light-emitting diode on or off.

In one embodiment of the illumination device according to the invention, in each group of light-emitting diode chips, the light-emitting diodes of said group have a different light color than the light-emitting diode chips of a neighboring group of light-emitting diode chips.

In a further aspect, the invention also relates to an optical sensor, in particular for a coordinate measuring machine, having a surface sensor for capturing radiation or a camera, and also an illumination device like the one described above, wherein the illumination device is arranged relative to the camera or to the surface sensor such that the center axis of the illumination device is located on the optical axis of the camera or of the surface sensor. The illumination device is intended to completely or partially illuminate a field of view of the camera, in particular to illuminate a workpiece at the location where the field of view of the camera is located. The optical axis of the surface sensor is in particular a normal axis to the sensor surface extending through the center of the sensor surface.

The camera can have the aforementioned surface sensor, for example a CCD, a CMOS, or an IR sensor.

The optical sensor can have an interface for data transmission. The optical sensor can have a lens, for example with a fixed focal length or a variable focal length. The lens can be part of a camera or be assigned to the camera.

In another aspect, the invention relates to a coordinate measuring machine having an optical sensor according to the invention. The coordinate measuring machine is for example a portal coordinate measuring machine, a horizontal-arm coordinate measuring machine, or a gantry coordinate measuring machine.

In a further aspect, the invention relates to the use of an optical sensor according to the invention or of an illumination device according to the invention for measuring a workpiece, in particular in a coordinate measuring machine.

In another aspect, the invention also relates to a method for measuring coordinates, in which an optical sensor according to the invention or an illumination device according to the invention is used. The method is characterized in particular in that one or more groups of light-emitting diode chips in the illumination device according to the invention are used for illumination, but not all of the light-emitting diode chips are used at the same time. This is called segmented illumination.

The invention is described below on the basis of exemplary embodiments. In the figures.

BRIEF DESCRIPTION OF THE DRAWINGS

DETAILED DESCRIPTION OF THE PREFERRED EMBODIMENTS

Figure 1:
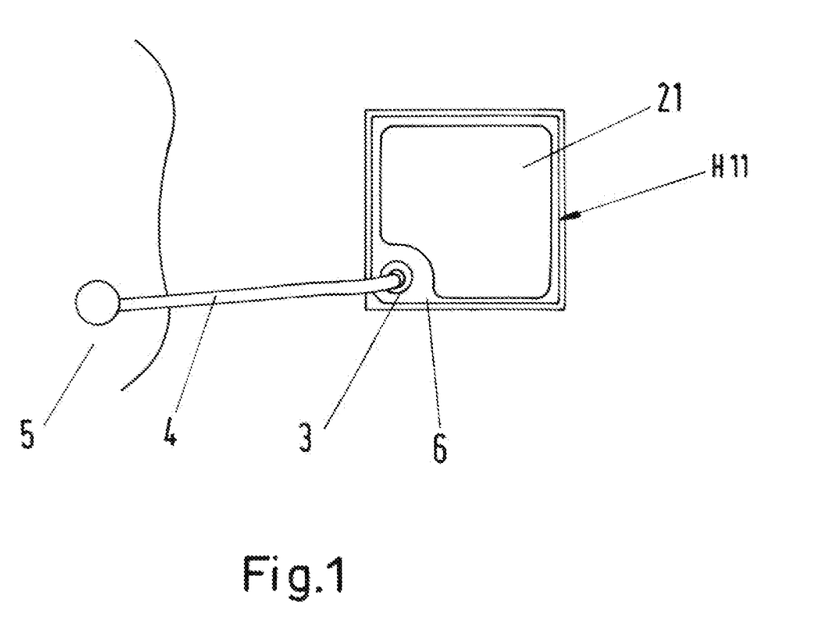
FIG. 1 shows a light-emitting diode chip in an individual view.

FIG. 1 shows a light-emitting diode chip H11 having the light-emitting surface 21. The light-emitting diode chip H11 has the connection point 3 for the bond wire 4 in the peripheral region 6 in the region of a corner.

The light-emitting diode chip H11 is part of an LED, of which no further parts are illustrated, for example of an LED package. The bond wire 4 is contacted at the other end at the contact point 5.

A cutout in the light-emitting surface 21 is located in the region of the connection point 3 to provide space for the connection point 3. No light can be emitted in the region of this cutout. Consequently, not the entire surface of the light-emitting diode chip H11 is designed for emitting light.

Figure 2:
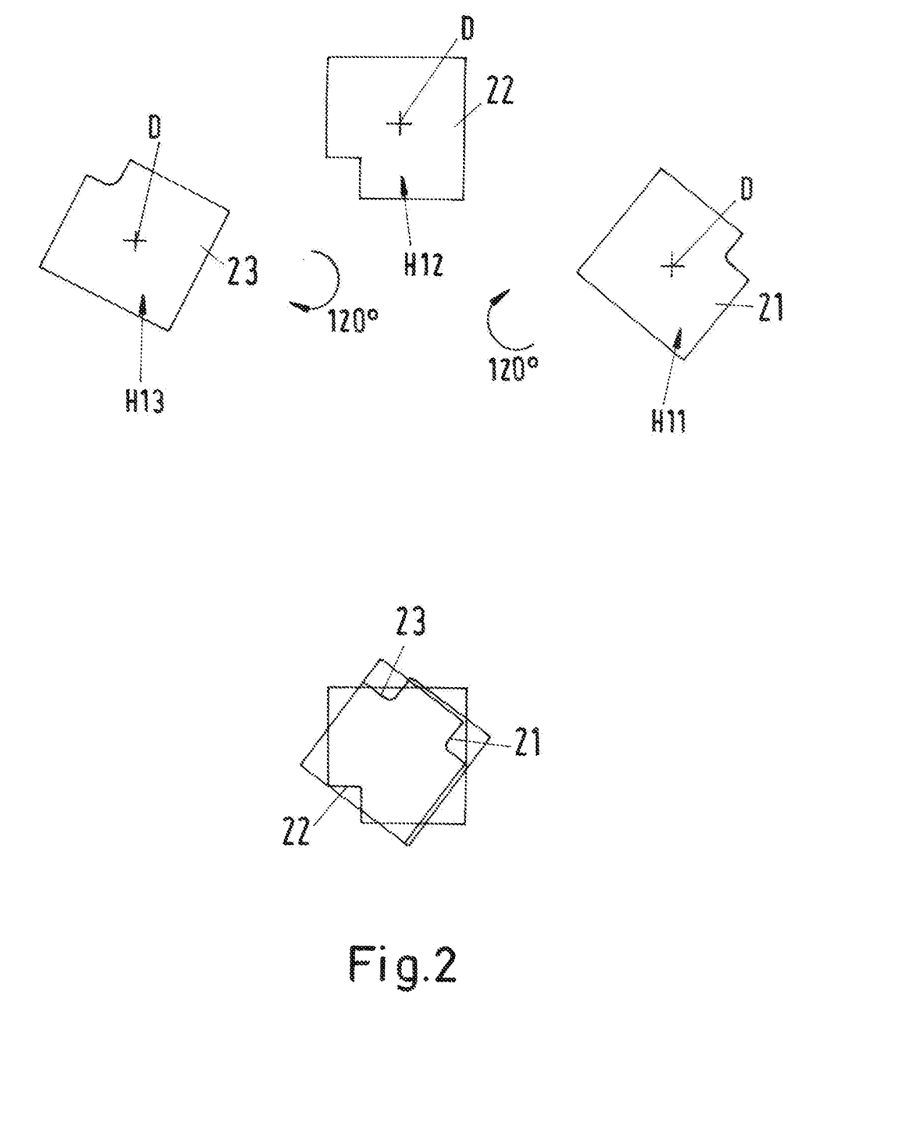
FIG. 2 shows a group of light-emitting diode chips in a rotated arrangement according to the invention.

FIG. 2 shows a group of light-emitting diode chips, consisting of the light-emitting diode chip H11 with the light-emitting surface 21, the light-emitting diode chip H12 with the light-emitting surface 22, and the light-emitting diode chip H13 with the light-emitting surface 23. Other parts than the light-emitting surface are not illustrated.

The light-emitting diode chips H11, H12, and H13 are rotated relative to one another. In the drawing, the angles of rotation are not exactly identical. However, in a preferred embodiment, starting from the same position of rotation of the light-emitting diode chip H11, the light-emitting diode chip H12 is rotated clockwise by 120° about the axis of rotation D to approximately reach the illustrated position of the light-emitting diode chip H12. Starting from the illustrated position of rotation of the light-emitting diode chip H12, the light-emitting diode chip H13 is rotated clockwise by 120° about the axis of rotation D to reach the illustrated position of rotation of the light-emitting diode chip H13. If the light-emitting diode chip H13 were to be rotated by 120° about the axis of rotation D from the illustrated position of rotation, the result would once again be the position of rotation of the light-emitting diode chip H11. Consequently, in a group of n=3 light-emitting diode chips, the angle of the relative rotation is 360°/3=120°. Similarly, this principle can be implemented in a group having a different whole number of n≤3.

On account of the rotation, the respective cutout in the light-emitting surface 21, 22, 23, where the connection point 3 is located and from which no light is emitted, is rotated into a different spatial direction. In the example shown, the arrangement shown at the bottom in FIG. 2 is obtained when the light-emitting surfaces 21, 22, 23 are laid on top of one another. It is evident that, owing to the uniform distribution of the cutouts, light emission that is as homogeneous as possible in various directions is achieved. Without rotation, all the cutouts in the light-emitting surfaces 21, 22, 23 would lie on top of one another in this view, and light emission would be less homogeneous. This would result in less uniform illumination.

Figure 3:
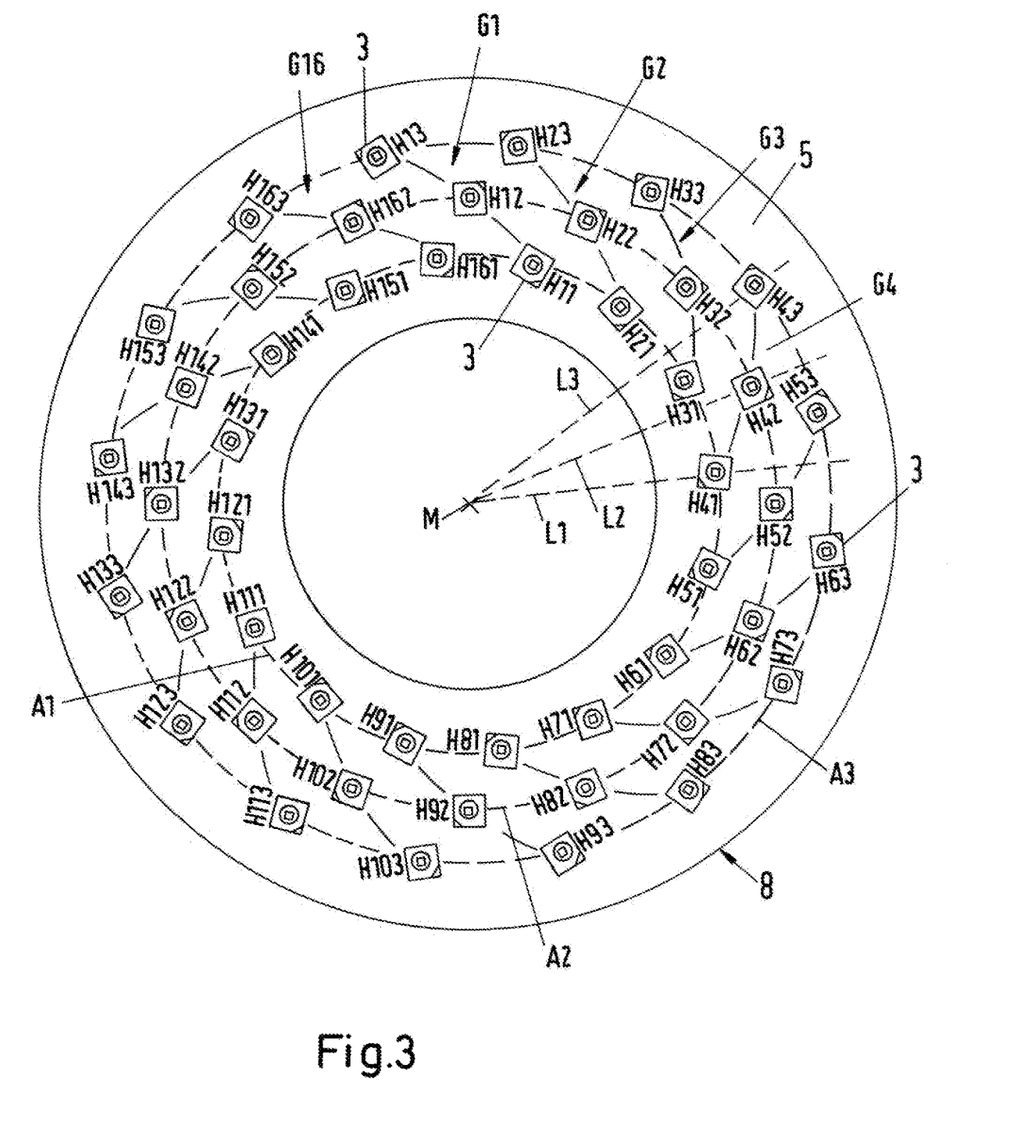
FIG. 3 shows an illumination device according to the invention.

FIG. 3 shows an illumination device 8 according to the invention in the form of a ring light.

A multiplicity of light-emitting diode chips H are arranged on the printed circuit board 5. The nomenclature of the light-emitting diode chips H is such that the last digit indicates the geometric figure on whose virtual outline the respective light-emitting diode chip is situated. The digit to the left thereof, or the two digits to the left thereof, indicate the number of the group to which the respective light-emitting diode chip belongs. For example, H11 designates a light-emitting diode chip of the first group on the virtual outline of the first geometric figure.

H23 designates a light-emitting diode chip of the second group on the virtual outline of the third geometric figure.

H142 designates a light-emitting diode chip of the 14th group on the virtual outline of the second geometric figure.

The drawing shows the outline A1 of a first geometric figure, the outline A2 of a second geometric figure, and the outline A3 of a third geometric figure, which all have the shapes of circles. All the geometric figures are concentric with respect to one another.

Consequently, the first light-emitting diode chips H11, H21, H31, H41, H51 . . . H161 are located on the outline A1, the second light-emitting diode chips H12, H22, H32, H42, H52 . . . H162 are located on the outline A2, the third light-emitting diode chips H13, H23, H33, H43, H53 . . . H163 are located on the outline A3. All the light-emitting diode chips are arranged around the center axis M, which is perpendicular to the drawing plane. The centers of the circular outlines A1, A2, and A3 are located on the center axis M.

The light-emitting diode chips H11, H12, H13 form the first group G1, the light-emitting diode chips H21, H22, H23 form the second group G2, and this principle continues up to the 16th group G16, formed from the light-emitting diode chips H161, H162, H163. For better illustration of the groups, the light-emitting diode chips that belong to the group are each connected by lines that are located in-between, which are purely virtual lines and do not represent real structures.

The above principle can be continued for further light-emitting diode chips, for example a fourth circular sphere may be present outside the outline A3, on which fourth sphere sixteen fourth light-emitting diode chips are arranged, of which in each case one is assigned to one of the groups G1, G2, G3, G4 . . . G16.

Each of said groups G1, G2 . . . G16 is individually drivable, or controllable, so that light sources can be switched on in segments around the circumference.

It may be provided that in a group, for example G1, a subset of light-emitting diode chips is drivable, or controllable, separately from other members of said group. For example, the light-emitting diode chips H11 and H12 can be drivable, or controllable, independently of H13.

Alternatively, light-emitting diode chips of group G1 can emit a different light color than light-emitting diode chips of group G2. It may be provided that alternating groups again have the same light color, for example G1 has the same light color as group G3, and group G2 has the same light color as group G4, wherein the light colors of G1, G3 differ from the light colors of G2, G4.

The connection point 3 of each light-emitting diode chip is shown as a black corner of each square chip. It is evident that in each group G1, G2, G3, G4 . . . G16 the connection points 3 of the respective light-emitting diode chips are oriented in different directions, in accordance with the principle shown in FIG. 2.

For group G4, three virtual straight lines L1, L2, L3 are illustrated. The light-emitting diode chip H41 is located on the straight line L1, the light-emitting diode chip H42 is located on the straight line L2, and the light-emitting diode chip H43 is located on the straight line L3. The angle between the straight line L1 and the straight line L2 is the same as the angle between the straight lines L2 and L3. Alternatively thereto, which is not shown here, it is also possible for all the light-emitting diode chips H41, H42, H43 of the group G4 to be located on the same straight line, for example on L1, in which case this principle is then preferably likewise applied to other groups.

Figure 4:
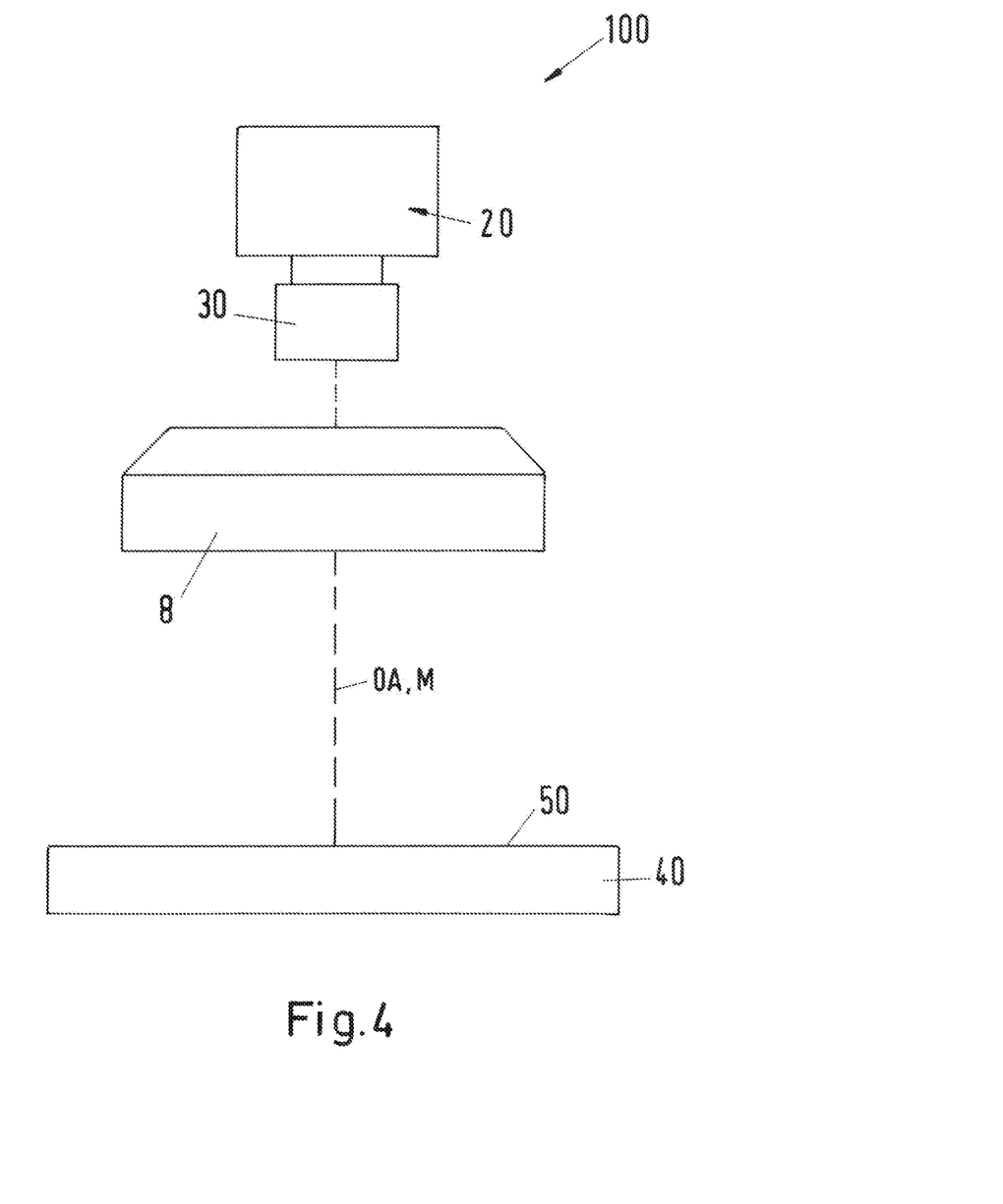
FIG. 4 shows an optical sensor according to the invention.

FIG. 4 shows the optical sensor 100 with the camera 20, the lens 30, and the illumination device 8 according to the invention in the form of a ring light. In contrast to FIG. 3, which shows the illumination device 8 from below, the illumination device 8 is here shown in a side view. The center axis M and the optical axis OA of the camera 20 coincide. The surface 50 of the workpiece 40 is illuminated. The illumination is in particular effected in segments, with only one, or only a selection, of the groups G1, G2 . . . G16 of light-emitting diode chips being activated for illumination, but not light-emitting diode chips of all groups at the same time, although this is likewise possible.

The invention claimed is:

1. An illumination device, comprising:
   first light-emitting diode chips arranged around a center axis along a virtual outline of a first geometric figure;
   second light-emitting diode chips arranged around the center axis along a virtual outline of a second geometric figure; and
   third light-emitting diode chips arranged around the center axis along a virtual outline of a third geometric figure, wherein:
   the second geometric figure is concentric with respect to the first geometric figure,
   the third geometric figure is concentric with respect to the first geometric figure,
   for each chip of the first, second, and third light-emitting diode chips, a bond wire is connected to a connection point of the chip that is located in a peripheral region of the chip,
   the first, second, and third light-emitting diode chips are grouped into a plurality of groups such that each group of the plurality of groups includes one of the first light-emitting diode chips, one of the second light-emitting diode chips, and one of the third light-emitting diode chips, and
   for a first group of the plurality of groups:
      the first light-emitting diode chip of the first group is arranged on a first virtual line,
      the second light-emitting diode chip of the first group is arranged on a second virtual line,
      the third light-emitting diode chip of the first group is arranged on a third virtual line,
      the first, second, and third virtual lines (i) each intersect only a single light-emitting diode chip, (ii) are transverse to the center axis, and (iii) originate at, and extend outwardly from, the center axis,
      the second light-emitting diode chip of the first group neighbors the first light-emitting diode chip of the first group,
      the third light-emitting diode chip of the first group neighbors the second light-emitting diode chip of the first group, and
      the first light-emitting diode chip, the second light-emitting diode chip, and the third light-emitting diode chip of the first group are rotated relative to one another such that the respective connection points are oriented in different directions.

2. The illumination device of claim 1, further comprising:
   fourth light-emitting diode chips arranged around the center axis along a virtual outline of a fourth geometric figure, wherein:
      the fourth geometric figure is concentric with respect to the first geometric figure,
      each group of the plurality of groups includes at least one of the fourth light-emitting diode chips, and
      the fourth light-emitting diode chip of the first group neighbors the third light-emitting diode chip of the first group.

3. The illumination device of claim 1, wherein an angle of the relative rotation for a pair of neighboring light-emitting diode chips in the first group is 360°/n, with n being a total count of light-emitting diode chips in the first group.

4. The illumination device of claim 1, wherein an angle between neighboring virtual lines is constant.

5. The illumination device of claim 1, wherein, in each group of the plurality of groups, at least two of the light-emitting diode chips in the group are controllable independent of light-emitting diode chips of another group of the plurality of groups.

6. The illumination device of claim 1, wherein, for each group of the plurality of groups, the light-emitting diodes in the group have a different light color than the light-emitting diode chips of a neighboring group of the plurality of groups.

7. The illumination device of claim 1, wherein each of the first and second geometric figures includes at least one of a circle, an ellipse, a rectangle, and a square.

8. An optical sensor comprising:
   a camera; and
   the illumination device of claim 1,
   wherein the illumination device is arranged relative to the camera such that the center axis of the illumination device is located on an optical axis of the camera.

9. An optical sensor comprising:
   a surface sensor; and
   the illumination device of claim 1,
   wherein the illumination device is arranged relative to the surface sensor such that the center axis of the illumination device is located on an optical axis of the surface sensor.

10. A method comprising:
    illuminating a workpiece using the illumination device of claim 1; and
    measuring the workpiece using a coordinate measuring machine.

11. The illumination device of claim 2, further comprising:
    fifth light-emitting diode chips arranged around the center axis along a virtual outline of a fifth geometric figure, wherein:
       the fifth geometric figure is concentric with respect to the first geometric figure,
       each group of the plurality of groups includes at least one of the fifth light-emitting diode chips, and
       the fifth light-emitting diode chip of the first group neighbors the fourth light-emitting diode chip of the first group.

12. A method comprising:
    measuring a workpiece using a coordinate measuring machine that includes the optical sensor of claim 8; and
    during the measuring, illuminating the workpiece using the illumination device.

13. A method comprising:
    measuring a workpiece using a coordinate measuring machine that includes the optical sensor of claim 9; and
    during the measuring, illuminating the workpiece using the illumination device.

* * * * *